(12) United States Patent
Roper et al.

(10) Patent No.: US 8,453,717 B1
(45) Date of Patent: Jun. 4, 2013

(54) MICRO-ARCHITECTED MATERIALS FOR HEAT SINK APPLICATIONS

(75) Inventors: Christopher S. Roper, Malibu, CA (US); William B. Carter, Woodland Hills, CA (US)

(73) Assignee: HRL Laboratories, LLC, Malibu, CA (US)

( * ) Notice: Subject to any disclaimer, the term of this patent is extended or adjusted under 35 U.S.C. 154(b) by 988 days.

(21) Appl. No.: 12/505,980

(22) Filed: Jul. 20, 2009

(51) Int. Cl.
 *F28F 7/02* (2006.01)
(52) U.S. Cl.
 USPC ........................................ 165/80.4; 165/80.5
(58) Field of Classification Search
 USPC ............... 165/80.3, 80.4, 80.5; 361/698, 703, 361/705; 257/712
 See application file for complete search history.

(56) References Cited

U.S. PATENT DOCUMENTS

| | | | |
|---|---|---|---|
| 3,984,861 A | 10/1976 | Kessler | |
| 4,602,679 A | 7/1986 | Edelstein | |
| 5,248,079 A * | 9/1993 | Li | 228/121 |
| 6,293,332 B2 | 9/2001 | Li | |
| 6,868,898 B2 | 3/2005 | Chau | |
| 6,888,720 B2 * | 5/2005 | Pfister et al. | 361/689 |
| 7,382,959 B1 | 6/2008 | Jacobsen | |
| 7,401,643 B2 | 7/2008 | Queheillalt | |
| 7,687,132 B1 | 3/2010 | Gross et al. | |
| 2005/0202206 A1 * | 9/2005 | Wadley et al. | 428/116 |
| 2006/0162907 A1 | 7/2006 | Wu | |
| 2007/0068654 A1 | 3/2007 | Chang | |
| 2007/0102140 A1 * | 5/2007 | Tuma et al. | 165/80.3 |
| 2007/0107875 A1 | 5/2007 | Lee | |
| 2007/0163755 A1 | 7/2007 | Kim | |
| 2010/0155033 A1 | 6/2010 | Holley | |
| 2010/0159398 A1 | 6/2010 | Rock | |

OTHER PUBLICATIONS

G. Carbajal, et al., "Thermal response of a flat heat pipe sandwich structure to a localized heat flux," International Journal of Heat and Mass Transfer, vol. 49, No. 21-22, pp. 4070-4081, 2006.
Douglas T. Queheillalt, et al., "A multifunctional heat pipe sandwich panel structure," International Journal of Heat and Mass Transfer, vol. 51, No. 1-2, pp. 312-326, 2008.
J. Tian, et. al, "The effects of topology upon fluid-flow and heat-transfer within cellular copper structures", International Journal of Heat and Mass Transfer, 2004.
T.J. Lu, et. al, "Active cooling by metallic sandwich structures with periodic cores", Progress in Materials Science, 2005, No. 50, p. 789-815.
U.S. Appl. No. 12/317,210 "Functionally-Graded Three-Dimensional Ordered Open-Cellular Microstructure and Method of Making Same", Alan J. Jacobsen, et. al, Application & Office Actions.
U.S. Appl. No. 11/870,379 "Ordered Open-Cellular Carbon Microstructure and Method of Making Same", Alan J. Jacobsen, Application & Office Actions.
U.S. Appl. No. 12/691,393 "Microtruss Based Thermal Heat Spreading Structures", William Carter, et. al, Application & Office Actions.

(Continued)

*Primary Examiner* — Teresa Walberg
(74) *Attorney, Agent, or Firm* — Daniel Allemeier; George Rapacki

(57) ABSTRACT

A heat sink comprising a heat spreader attached to a three-dimensional ordered open-cellular microstructure material. The three-dimensional ordered open-cellular microstructure material has dimensions that allow for large surface area to volume ratios. The three-dimensional ordered open-cellular microstructure may be comprised of hollow truss elements and partially filled with a thermally conductive material or a fluid.

16 Claims, 10 Drawing Sheets

OTHER PUBLICATIONS

U.S. Appl. No. 12/577,991 "Micro-Truss Based Composite Friction-and-Wear Apparatus and Methods of Manufacturing the Same", Robert Cumberland, et. al, Application & Office Actions.

U.S. Appl. No. 12/691,322 "Microtruss Based Thermal Plane Structures and Microelectronics and Printed Wiring Board Embodiments", William Carter, et. al, Application & Office Actions.

U.S. Appl. No. 12/405,996 "Ordered Open-Cellular Materials for Mass Transfer and/or Phase Separation Applications", Christopher S. Roper, Application & Office Actions.

Office actions for U.S. Appl. No. 12/506,014 filed Jul. 20, 2009.

Office Actions for 080912 U.S. Appl. No. 12/383,378 filed Mar. 23, 2009.

Office actions for 070701 U.S. Appl. No. 12/691,322 filed Jan. 21, 2010.

* cited by examiner

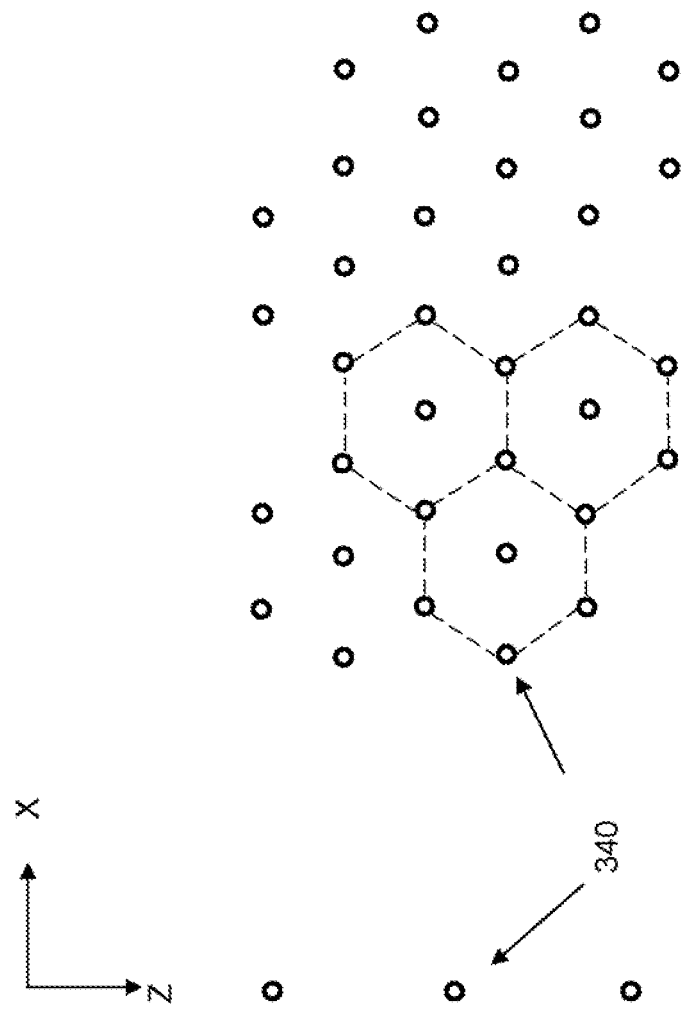
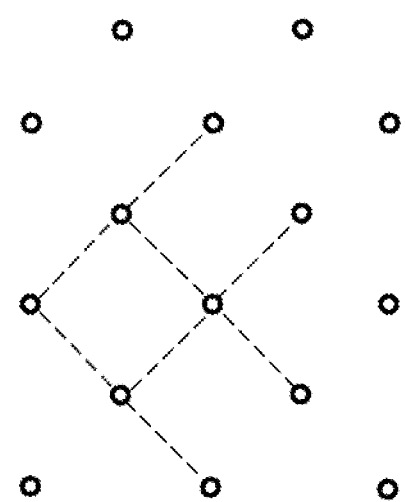
FIG. 4b
FIG. 4a

US 8,453,717 B1

MICRO-ARCHITECTED MATERIALS FOR HEAT SINK APPLICATIONS

FIELD OF THE INVENTION

The present invention relates to the area of heat sinks using conduction and or convection, and in particular, heat sinks capable of supporting mechanical loads.

BACKGROUND OF THE INVENTION

Heat sinks transfer heat from a hot area to a cooler area. Certain forms of heat sinks use fins or louvers but these heat sinks have difficulty supporting mechanical loads. In addition, odd shaped surfaces or even substantially non planar surfaces can be difficult to cool with heat sinks known in the art. Various heat sink designs include fins, pin fins, corrugated, and louvered fins. These designs may be incorporated in heat pipes and heat spreaders. These designs (with the exception of louvered fins) may have worse performance in terms of low heat transfer than truss designs. Furthermore, louvered fin designs cannot support loads, unlike truss designs, and are expensive to manufacture.

The use of a truss architecture for active cooling has been reported in literature (for instance, Lu, Valdevit, Evans, "Active cooling by metallic sandwich structures with periodic cores", Progress in Materials Science 50 (2005) 789-815) However, the only fabrication methods described are expensive, limited to a single truss layer, and limited to large truss unit cell sizes.

Tian, Wadley, et al. (in "The effects of topology upon fluid-flow and heat-transfer within cellular copper structures", International Journal of Heat and Mass Transfer volume 47, issues 14-16, July 2004, p. 3171-3186) have experimentally investigated copper ordered cellular materials as heat sinks. The structures described therein are constrained to simple, flat geometries, do not have enhancements for increased convective heat transport, and are not designed to support a load while transferring heat.

As such, there is a need for heat sinks that can support a mechanical load, that are economical to manufacture and that can conform to odd shapes.

SUMMARY OF THE INVENTION

Aspects of embodiments of the present invention are directed toward a set of applications for three-dimensional ordered open-cellular microstructure materials in heat sinks. In particular, a heat sink device comprising a heat spreader; and a three-dimensional ordered open-cellular microstructure material attached to the heat spreader for a heat sink application. The open-cellular microstructure material comprises: a plurality of first truss elements defined by a plurality of first self-propagating polymer waveguides and extending along a first direction; a plurality of second truss elements defined by a plurality of second self-propagating polymer waveguides and extending along a second direction; and a plurality of third truss elements defined by a plurality of third self-propagating polymer waveguides and extending along a third direction, wherein the first, second, and third ordered truss elements interpenetrate each other at a plurality of nodes to form a continuous material. The heat sink may include a face sheet.

The three-dimensional ordered open-cellular microstructure material may be comprised of a plurality of layers and may be comprised of at least two different materials. The at least two different materials may include two metals, two ceramics or selected from ceramics and metals. The three-dimensional ordered open-cellular microstructure material may comprise a plurality of mechanical members having a three-dimensional order with a size scale between about ten micrometers and about five millimeters to increase the surface area to volume ratio of the three-dimensional ordered open-cellular microstructure material. The three-dimensional ordered open-cellular microstructure material may have an open volume fraction between about 0.4 and 0.6. The three-dimensional ordered open-cellular microstructure material may be comprised of hollow truss elements. The hollow truss elements may be at least partially filled with a material or a fluid. The angle between intersecting truss elements of the open-cellular microstructure material may be less than 90 degrees.

In an alternative embodiment, the heat sink may comprise a heat spreader and ordered open-cellular microstructure material wherein the ordered open-cellular microstructure material further comprises: a plurality of first truss elements defined by a plurality of first self-propagating polymer waveguides of the first three-dimensional pattern and extending along a first direction; a plurality of second truss elements defined by a plurality of second self-propagating polymer waveguides of the first three-dimensional pattern and extending along a second direction; a plurality of third truss elements defined by a plurality of third self-propagating polymer waveguides of the first three-dimensional pattern and extending along a third direction; a plurality of fourth truss elements defined by a plurality of fourth self-propagating polymer waveguides of the second three-dimensional pattern and extending along a fourth direction; a plurality of fifth truss elements defined by a plurality of fifth self-propagating polymer waveguides of the second three-dimensional pattern and extending along a fifth direction; a plurality of sixth truss elements defined by a plurality of sixth self-propagating polymer waveguides of the second three-dimensional pattern and extending along a sixth direction; and an interface, wherein the first, second, and third truss elements interpenetrate each other at a plurality of first nodes to form a first continuous material, wherein the fourth, fifth, and sixth truss elements interpenetrate each other at a plurality of second nodes to form a second continuous material, and wherein the interface comprises a plurality of third nodes for connecting the first continuous material to the second continuous material.

The heat sink of any embodiment may use three-dimensional ordered open-cellular microstructure material having a surface area to volume ratio between about 300 and 15000 $m^2/m^3$.

Another embodiment of this invention comprises a method of cooling a device with a heat sink, the method comprising: attaching a heat sink to the device; wherein the heat sink comprises a three-dimensional ordered open-cellular microstructure material and a heat spreader. The method of cooling a device further comprising interposing a thermal interface material between the heat sink and the device to be cooled.

In an alternative embodiment of the invention, a method of constructing a conformal heat sink comprising: forming a three-dimensional ordered open-cellular microstructure material; deforming the three-dimensional ordered open-cellular microstructure material to a desired shape; coating the deformed three-dimensional ordered open-cellular microstructure material truss elements; removing the three-dimensional ordered open-cellular microstructure core material. The core of the deformed three-dimensional ordered open-cellular microstructure material may be filled with another material. The deformed three-dimensional ordered open-cellular microstructure may be coated by electroplating or chemical vapor infiltration.

BRIEF DESCRIPTION OF THE DRAWINGS

The accompanying drawings, together with the specification, illustrate exemplary embodiments of the present invention, and, together with the description, serve to explain the principles of the present invention.

FIG. 1 may be thought of as defining a single cell of the microstructure.

FIG. 2 shows multiple unit cells arranged in layers to form a heat sink structure.

FIG. 4a illustrates an example of a square mask pattern (or a square mask aperture pattern) according to embodiments of the present invention. The dotted lines are fictional to aid the reader is seeing the pattern of squares.

FIG. 4b illustrates an example of a hexagonal mask pattern (or a hexagonal mask aperture pattern) according to embodiments of the present invention. The dotted lines are fictional to aid the reader is seeing the pattern of hexagons.

DETAILED DESCRIPTION

In the following detailed description, only certain exemplary embodiments of the present invention are shown and described, by way of illustration. As those skilled in the art would recognize, the described exemplary embodiments may be modified in various ways, all without departing from the spirit or scope of the present invention. Accordingly, the drawings and description are to be regarded as illustrative in nature, and not restrictive.

In the context of embodiments of the present invention, a three-dimensional ordered microstructure is referred to as an ordered three-dimensional structure at the micrometer scale. In one embodiment of the present invention, a heat sink composed of a three-dimensional ordered microstructure is provided. Here, the heat sink transfers heat from a device to be cooled to the environment through conduction and/or convection. Optionally, the three-dimensional ordered microstructure may be attached to a heat spreader.

An alternative embodiment of the present invention utilizes a microstructure with hollow truss members. Another embodiment uses microstructure truss members made of metal or carbon. The hollow microstructure truss members may be metal or carbon on the inside.

The microstructure may be comprised of one or more layers of microstructure truss members. The layers may be formed in one process or several. A layer is characterized and defined by the substantially identical dimensions of the truss elements, the substantially uniform node-to-node spacing and the substantially uniform included angle between intersecting truss elements. The microstructure layers may be from separate processes and layered after the individual layers have completely formed. Individual layers maybe held together through soldering, brazing, welding, using adhesives or other methods known in the art for mechanically or chemically bonding materials.

Figure 1:
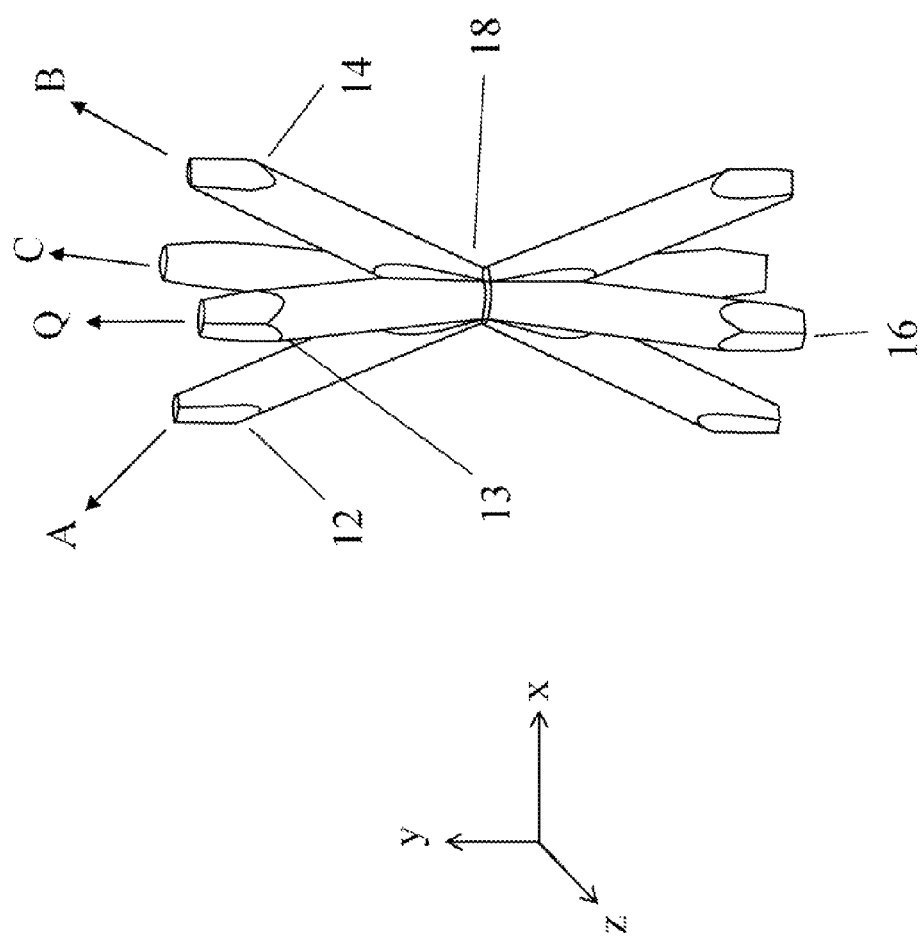
FIG. 1 is a perspective schematic view of a portion of a structure according to an embodiment of the present invention.
Figure 2:
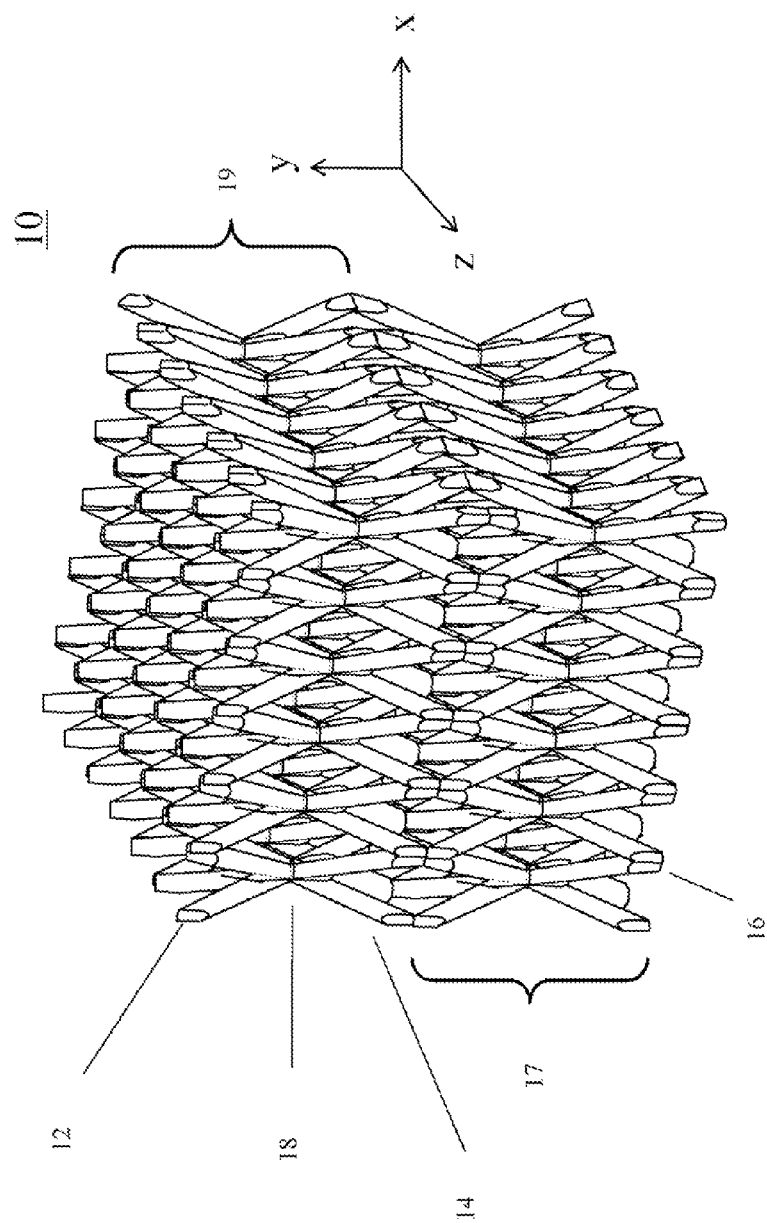
FIG. 2 is a perspective schematic view of a structure according to an embodiment of the present invention.

Referring to FIGS. 1 and 2, a three-dimensional ordered open-cellular microstructure 10 according to an embodiment of the present invention is a self-supporting structure composed of a number of unit cells as shown in FIG. 1, interconnected as shown in FIG. 2. Note that while FIG. 2 shows the three-dimensional ordered open-cellular microstructure in two layers 17 and 19, this is not meant as a limitation. A preferred embodiment of the present invention comprises a three-dimensional ordered open-cellular microstructure comprising several layers 17 in the y direction. In one embodiment of the present invention, this three-dimensional ordered open-cellular microstructure 10 can be utilized as a three-dimensional ordered microstructure to define (or derive) the final shape and dimensions of a heat sink that conforms to the device to be cooled. The microstructure 10 includes first truss elements 12, second truss elements 13, third truss elements 14, and optional fourth truss element 16. The first truss elements 12 are defined by first self-propagating polymer waveguides and extend along a first direction A. The second truss elements 13 are defined by second self-propagating polymer waveguides and extend along a second direction Q. The third truss elements 14 are defined by third self-propagating polymer waveguides and extend along a third direction B. The optional fourth truss elements 16 are defined by fourth self-propagating waveguides and extend along a fourth direction C. The first, second, third, and optionally fourth ordered truss elements are coupled at a plurality of nodes 18 unperturbed by changes in index of refraction caused by photopolymerization of the first, second, third or fourth self-propagating polymer waveguides and defined by waveguide intersections of the first, second, third and optionally fourth self-propagating polymer waveguides.

With reference to FIGS. 1 and 2, the truss elements 12, 13, 14, 16 interpenetrate each other at nodes 18 to form a continuous material with a three-dimensional microstructure order. While four truss elements have been shown and described, this is not meant to imply any limitation. The skilled person in the art would realize that a three-dimensional ordered open-cellular microstructure may be built of unit cells comprising three, four, five or more truss elements.

In one embodiment, the truss elements 12, 13, 14, 16 comprise a photo-polymer material. In one embodiment, the truss elements 12, 13, 14, 16 are polymer optical waveguide truss elements.

In one embodiment, each truss element is continuously formed such that it lacks interior boundaries; that is, no boundaries within the interpenetrating portions of truss elements 12, 13, 14, 16. As a result, the truss elements are solid and extend through multiple layers.

Hollow truss elements may be formed by starting with the photo-polymerized trusses then covering the exterior of the trusses with a material through, as non limiting examples, electroplating, investment casting or chemical vapor infiltration and finally removing the polymer truss material with, as non limiting examples, a solvent, selective etchant, or by carbonizing the polymer material. The resulting truss elements are hollow and a fluid can move, for example, from truss element 12 to truss elements 14 or 16 through the node 18.

Solid truss elements of metal or other non polymer material may be formed, as non limiting examples, by plating the polymer truss elements through electroplating, investment casting or chemical vapor infiltration, removing the polymer material then filling the resulting hollow truss elements with metal or other material.

According to one embodiment of the present invention, the microstructure 10 is formed by using a fixed light input (collimated UV light) to cure (polymerize) polymer optical waveguides, which can self-propagate in a 3D pattern. As such, the propagated polymer optical waveguides form the microstructure 10.

As disclosed in Monro et al. "Topical Review Catching Light In Its Own Trap," Journal Of Modern Optics, 2001, Vol. 48, No. 2, 191-238, which is incorporated by reference herein in its entirety, some liquid polymers, referred to as photopolymers, undergo a refractive index change during the polymerization process. The refractive index change can lead to a formation of polymer optical waveguides. If a monomer that is photo-sensitive is exposed to light (typically UV) under the right conditions, the initial area of polymerization, such as a small circular area, will "trap" the light and guide it to the tip of the polymerized region, further advancing that polymerized region. This process will continue, leading to the formation of a waveguide structure with approximately the same cross-sectional dimensions along its entire length.

According to one embodiment of the present invention, a mask 330 with a two-dimensional pattern of apertures (see FIG. 3) is used to create a three-dimensional polymer microstructure (or an open-cellular polymer microtruss structure).

Figure 3:
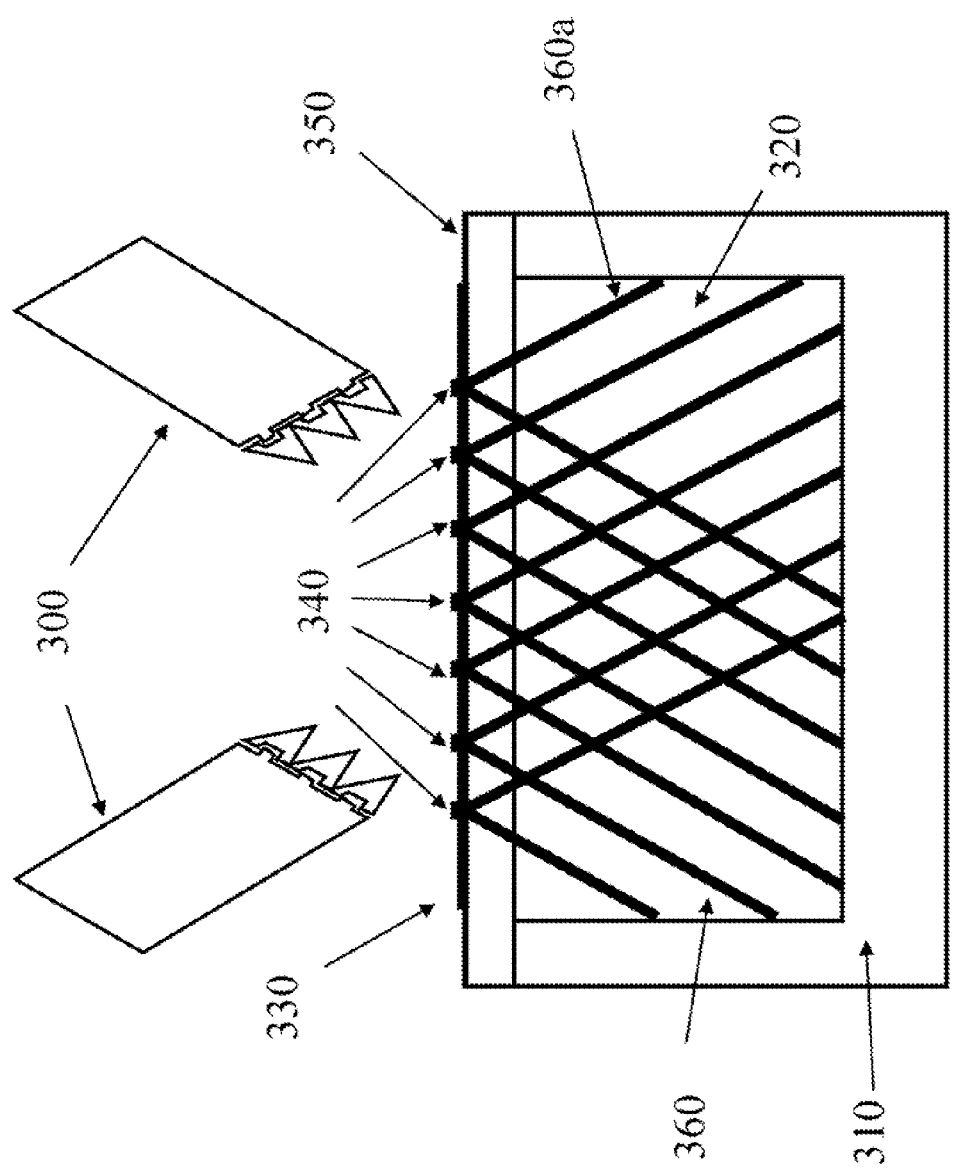
FIG. 3 is a schematic diagram of a system for forming a structure of an embodiment of the present invention from multiple waveguides created using a single collimated beam or multiple collimated beams through multiple apertures.

With reference to FIG. 3, a system for forming a three-dimensional polymer microstructure according to an embodiment of the present invention includes one or more collimated light sources 300, a reservoir (mold) 310 having a volume of monomer 320 that will polymerize at a wavelength of collimated light beams provided by the light sources 300, and a patterning apparatus, such as a mask 330 with multiple apertures (open areas) 340. Each of the apertures 340 has a given shape and dimension substantially matching a cross-section geometry of a waveguide (e.g., waveguide 360a). Between the mask 330 and the monomer 320, there may be a substrate 350. Here, in FIG. 3, a truly 3D network can be formed because the intersecting polymer waveguides 360 will simply polymerize together, but will not interfere with waveguide propagation.

When the polymerizing light from the collimated light sources 300 are used concurrently the waveguides are formed concurrently. As a result, the intersections of waveguides will not exhibit a discontinuity in the waveguide caused by the difference in index of refraction between the uncured polymer and the polymerized waveguide. If the waveguides are formed serially then light in a later formed waveguide will encounter a change in index of refraction when the light hits a previously formed waveguide. The result will be a discontinuity in the waveguide. By contrast, concurrent formation of the waveguides results in the polymerizing light encountering substantially the same index of refraction throughout the waveguide formation process. The result with concurrent waveguide formation is the intersections 18 of waveguides being unperturbed by changes in index of refraction during the waveguide formation process.

The spacing between the plurality of waveguides 360 corresponds with the pattern of the plurality of apertures 340. The pattern of the apertures 340 may, as a non-limiting example, be in a square pattern as shown in FIG. 4a and/or in a hexagonal pattern as shown in FIG. 4b. The hole (aperture) spacing, i.e., distance between apertures 340 in the mask 330, and the number of waveguides 360 formed from each of the apertures 340 will determine the open volume fraction (i.e. open space) of the formed three-dimensional ordered microstructure (or the formed open-cellular polymer microtruss structure). Without implying a limitation, the aperture spacing is on the order of 0.01 mm to 1.0 mm.

As such, through the system of FIG. 3, a three-dimensional ordered microstructure of an embodiment of the present invention can be designed for a given application. The design parameters include: 1) the angle and pattern of the polymer waveguides with respect to one another, 2) the relative density of the resulting cellular structure (or the open volume fraction), and 3) the cross-sectional shape and dimensions of the polymer waveguides. Here, in one embodiment, the waveguide (or truss) diameter can range from 10 microns to 5 mm depending on the design criteria. The length of the waveguide between waveguide nodes of interpenetrating waveguides can be between 5 and 15 times the diameter. In addition, the number of nodes, or the number of repeating unit cells, through the thickness can be designed. Typical microtruss 10 structures can have one-half unit cell to five unit cells through the thickness. Moreover, due to the method of formation of the three-dimensional ordered microstructure (or the open-cellular polymer microtruss structure) according to an embodiment of the present invention and as described in following method shown in FIG. 5, the propagation distances and/or the nodes of the interpenetrating waveguides are unperturbed by the change in index of refraction caused by polymerization.

Figure 10:
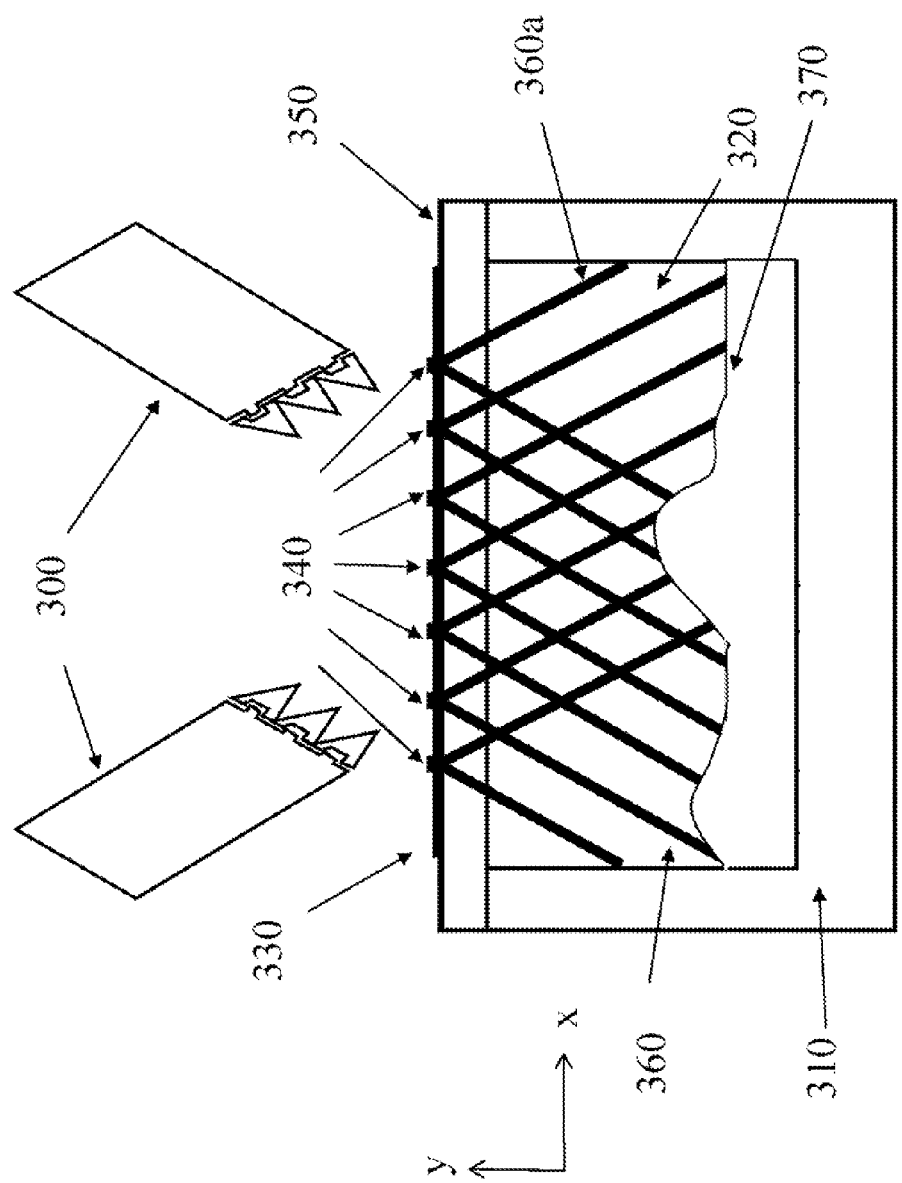
FIG. 10 is a schematic diagram of a system for forming a microtruss structure of an embodiment of the present invention from multiple waveguides as in FIG. 3 but conforming to an irregular shape.

The microstructure of FIG. 3 may be built to accommodate an irregular surface 370 such as shown in FIG. 10. In FIG. 10, a blank or die is added to the mold of the microtruss forming machine to terminate the formation of the truss members such that they conform to the irregular surface 370.

Alternatively, there is an another method for creating a micro-truss heat sink for non-planar surfaces in addition to the method shown in FIG. 10.

1. Create polymer micro-truss as shown in FIG. 3.
2. Deform (e.g. bend, stretch, etc.) the polymer micro-truss to a desired shape.
3. Electroplate (or chemical vapor infiltrate) the deformed micro-truss to coat the truss elements with metal or ceramic.
4. Dissolve or etch the polymer micro-truss core with a suitable solvent or etchant.
5. Optionally, refill hollow core members with another material.

Figure 5:
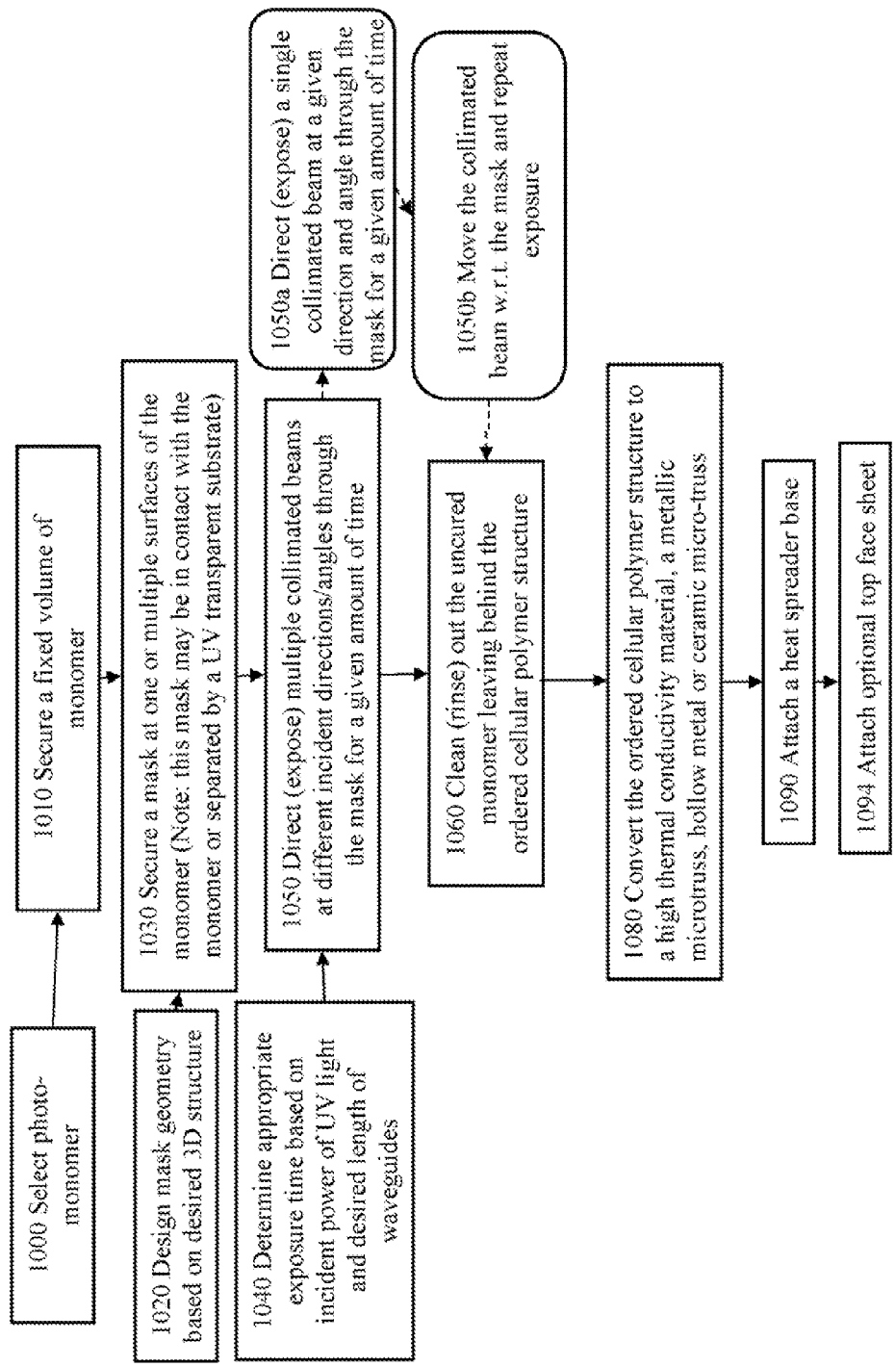
FIG. 5 is a process flow diagram for forming one or more polymer waveguides of a structure according to an embodiment of the present invention.

FIG. 5 shows a method of forming a heat sink comprising a three-dimensional ordered microstructure (or an open-cellular polymer microtruss structure) according to an embodiment of the present invention. As illustrated in FIG. 5, a photo-monomer is selected in block 1000. In block 1010, a volume of the selected photo-monomer is secured (e.g., in a reservoir). A mask geometry is designed based on a desired three-dimensional structure in block 1020. A patterning apparatus, such as a mask having the designed geometry, is secured in block 1030. Here, the secured mask 330 has at least one aperture 340 between at least one collimated light source and the volume of the selected photo-monomer. In addition, the mask may be in contact with the monomer or separated by a substrate (e.g., by a UV transparent substrate).

In block 1040, an appropriate exposure time is determined based on incident power of a collimated light beam from the at least one collimated light source (e.g., an incident power of a UV light) and a desired length of one or more waveguides. The collimated light beam from the at least one collimated light source is directed to the mask 330 for a period of exposure time so that a portion of the collimated beam passes through the mask 330 and is guided by the at least one aperture into the photo-monomer to form at least one waveguide through a portion of the volume of the photo-monomer. Here, the at least one waveguide has a cross-sectional geometry substantially matching the designed aperture 340 geometry on the mask 330.

In one embodiment as shown in block 1050, multiple collimated beams at different incident directions and/or angles are directed through the mask 330 for a given amount of time.

Alternatively, as shown in blocks 1050a, a single collimated beam at a given direction and angle is directed through the mask 330 for a given amount of time. Then, at block 1050b, the collimated light beam is moved with respect to the mask and the exposure is repeated.

Then, at block 1060, any uncured photo-monomer is removed to leave behind a three-dimensional ordered polymer microstructure 10 (or an open-cellular polymer microtruss structure). Here, in one embodiment, the plurality of polymer waveguides are used to form the three-dimensional ordered polymer microstructure 10, and the three-dimensional ordered polymer microstructure 10 corresponds with the pattern of the plurality of apertures 340.

The resulting three-dimensional polymer microstructure 10 can be formed in seconds in the area exposed to the incident collimated beam. Since the incident light and the monomer remain fixed with respect to one another during the formation of a polymer waveguide, the exposure area of the collimated beam(s) can be scanned over a larger surface area of monomer, leading to the formation of large-area structures in the x-z plane. Alternatively, in one embodiment, a volume of monomer can continuously be fed under a fixed incident light pattern (created from a mask and collimated light) leading to a path for mass production.

Once the polymer cellular structure is formed in the volume of monomer, the remaining un-polymerized material (monomer) is removed in step 1060 of FIG. 5 leaving an open cellular polymer material that is the three-dimensional ordered microstructure 10 (or the open-cellular polymer microtruss structure). By way of example, a solvent that dissolves the monomer (but not the polymer) may be used to aid in the monomer removal.

The polymer cellular structure formed at this point comprises one or more layers 17 and 19 of truss elements as shown in FIG. 2 but is not necessarily a good heat sink. The microstructure may have its thermal conductivity improved in step 1080 by plating the microtrusses with a metal or ceramic or by replacing the polymer microtrusses with a thermally conductive metal or ceramic while preserving the microstructure architecture. Various methods are known in the art for plating the microstructure such as chemical vapor infiltration. Hollow truss elements may be formed by plating the microtruss elements 12, 13, 14 and 16 then removing the photopolymerized material within the plated truss elements with a suitable solvent and finally using a process such as chemical vapor infiltration to fill the microtruss elements with a thermally conductive material.

Finally, in step 1090 a heat spreader base 22 may be added to the microstructure. The heat spreader base 22 is preferably metal and preferably copper or other high thermal conductivity material. The heat spreader base is mechanically or chemically bonded to the microstructure material through soldering, brazing, welding, use of an adhesive, or other techniques known in the art. Optionally, in step 1094 of FIG. 5, a face sheet 20 may be added to the microstructure material. Additionally and optionally, but not shown in FIG. 5, a thermal interface material 24 may be added to the heat spreader base opposite the microstructure. This material may be an adhesive to bond the heat sink to the device to be cooled.

Other alternatives in the construction of a heat sink 100 include replacing the face sheet 20 with a hollow collector 21 for vapor or fluid.

Multiple layers 17 and 19 of the three-dimensional ordered open-cellular microstructure shown in FIG. 2 may be formed concurrently with the correct design of the mask and use of the collimated lights. Alternatively, layers may be built up by stacking and attaching layers 17 and 19 to achieve a desired thickness. The layers 17 and 19 may have an interface layer between them or the layers may simply be stacked, either with trusses aligned or not, although preferably aligned to maximize the heat transfer through the heat sink. The layers may be attached to each other by welding, brazing, soldering, using adhesive or other ways well known in the art.

With reference back to FIGS. 1 and 2, the truss elements 12, 13, 14, and optionally 16 of the three-dimensional ordered open-cellular microstructure (microstructure) 10 define an open volume (i.e. free space) of the microstructure 10. In one embodiment, the microstructure 10 defines a free space of not less than about 40% by volume and not greater than about 99% by volume. In another embodiment, the microstructure 10 defines a free space of not less than about 70% by volume and not greater than about 95% by volume. Free space is defined as the volume of a rectangular cell with vertices defined by the ends of the truss, less the volume of the truss elements divided by the volume of the rectangular cell. Free space is synonymous with porosity.

The truss elements 12, 13, 14, and optionally 16 intersect at the nodes 18 to form symmetrical angles in three dimensions (three orthogonal directions). The symmetrical angles relative to the x-z-plane (see, FIG. 1), can measure between 0° and 90°. That is, truss elements 12, 13, 14, and optionally 16 interpenetrate each other to form "perfect" (i.e. unperturbed) nodes: each of the truss elements 12, 13, 14, and optionally 16 defines an angle relative to a compression surface of the microstructure 10 (e.g. a surface extending along a direction in the x-z plane), and the respective angles defined by the truss elements 12, 13, 14, and optionally 16 are substantially equal to one another. That is, in one embodiment, these nodes are unperturbed by changes in index of refraction caused by photopolymerization due to their formation as described with respect to FIG. 5. However, embodiments of the present invention are not limited thereto.

In one embodiment, each of the truss elements 12, 13, 14, and optionally 16 has a diameter of not greater than about 500 μm. Preferred dimensions of the truss are a diameter between 10 μm and 1 mm and a length between 100 μm and 10 mm.

In another embodiment, each of the truss elements 12, 13, 14, and optionally 16 has a diameter of not greater than about 200 μm. In another embodiment, each of the truss elements 12, 13, 14, and optionally 16 has a diameter of not greater than about 1 μm. The truss elements 12, 13, 14, and optionally 16 are configured to have a correspondingly small aspect ratio (e.g., length/diameter ratio) for withstanding a bending moment. Here, each of the truss elements 12, 13, 14, and optionally 16 has a length not greater than 100 μm such that the truss elements can better withstand a mechanical load applied to the microstructure 10. As such, the truss elements 12, 13, 14, and optionally 16 experience little, if any, bending deformation during application of the mechanical load to the microstructure 10.

At certain dimensions (e.g., the dimensions described above), the strength of the truss elements is increased, which corresponds to an increased strength of the microstructure 10. In one embodiment, each of the truss elements 12, 13, 14, and optionally 16 has molecular alignment extending along an axial direction of the truss element. As such, an anisotropic material is produced, which provides a substantial degree of stiffness and/or strength along the axial direction. In one embodiment, in a material that is composed of long molecular chains (e.g., polymers), the molecules thereof can be aligned along a direction to provide an increased degree of mechanical strength and/or stiffness along the alignment direction. Where the molecular alignments of the truss elements 12, 13, 14, and optionally 16 extend along the corresponding axial directions, the truss elements 12, 13, 14, and optionally 16 are configured to axially transfer a mechanical load applied to the microstructure 10.

The microstructure 10 withstands a mechanical load through axial tension and compression of the truss elements 12, 13, 14 and optionally, 16. Molecular alignment of the truss elements 12, 13, 14, and optionally 16 along their respective axial directions lends additional strength and/or stiffness to the truss elements 12, 13, 14, and optionally 16 and, accordingly, also to the microstructure 10. Structural strength is improved by having interpenetrating truss elements 12, 13, 14, and optionally 16 intersect at node 18.

In one embodiment, the truss elements 12, 13, 14, and optionally 16 are configured to provide the microstructure 10 with a stretch-dominated behavior under a compression load applied to the microstructure 10. Such stretch-dominated behavior is contrasted from the bending-dominated behavior (e.g. of randomly oriented cellular structures), as described in Ashby, "The Properties Of Foam And Lattices," Philosophical Transactions—Royal Society Of London Series A Mathematical Physical And Engineering Sciences, Vol. 364, 2006, which is incorporated by reference herein in its entirety.

In a bending-dominated structure, the elastic modulus is proportional to the square of the relative density $\rho'/\rho_s'$, where $\rho'$ is the density of the cellular material and $\rho_s'$ is the density of the solid from which it is constructed. In contrast, a stretch-dominated structure (such as microstructure 10), has a compressive elastic modulus (E) directly proportional to both the relative density thereof and the modulus ($E_s$) of the solid material portion of the microstructure 10, as expressed in equation (1) below:

$$E = E_s(\sin^4\theta)(\rho/\rho_s) \tag{1}$$

where $\rho$ is a density of the microstructure 10, $\rho_s$ is a density of a solid material portion of the microstructure 10, $\theta$ is an angle of at least one of the truss elements 12, 13, 14, and optionally 16 relative to a compression surface of the microstructure 10, and $E_s$ is a modulus of the solid material portion of the microstructure 10. As such, the elastic modulus of a structure of embodiments of the present invention is also proportional to a geometric function of the angle $\theta$ of the structure, and $\theta$ can accordingly be chosen to vary (e.g., increase or reduce) the elastic modulus.

Figure 6:
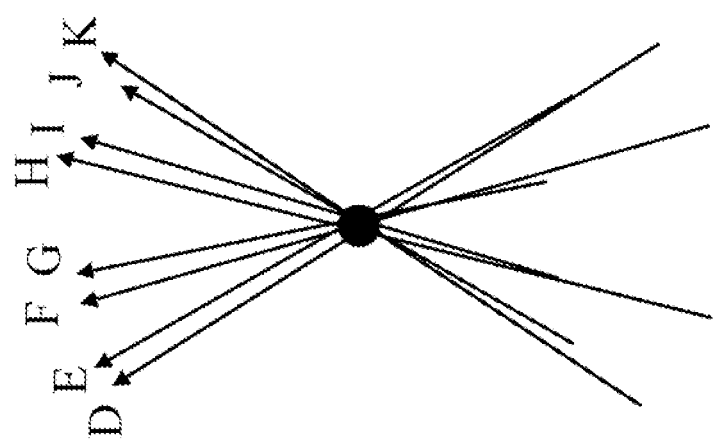
FIG. 6 is a perspective schematic view showing respective directions along which truss elements of a structure of an embodiment of the present invention extend.

With reference back to FIGS. 1 and 2, the microstructure 10 includes truss elements 12, 13, 14, and optionally 16 respectively extending along A, B, Q, and C directions. However, embodiments of the present invention are not limited thereto. For example, with reference to FIG. 6, a structure of an embodiment of the present invention may include truss elements defined by self-propagating polymer waveguides and extending along D, E, F, G, H, I, J and K directions, respectively. For example, a structure according to an embodiment of the present invention may include eight truss elements, each of which extends along a corresponding one of eight varying directions. Here, similar to the embodiment shown in FIGS. 1 and 2, the eight truss elements interpenetrate each to form nodes of a continuous material with a three-dimensional microstructure order. However, embodiments of the present invention are not limited thereto, and may include more or fewer than eight truss elements.

Embodiments of the present invention provide a set of heat sink applications comprising three-dimensional ordered open-cellular microstructure (e.g., as described above and depicted in FIGS. 7, 8 and 9). Fabrication of polymer versions of these materials as well as conversion into metallic and ceramic versions are described in U.S. Pat. No. 7,382,959, entitled "Optically Oriented Three-Dimensional Polymer Microstructures," the entire content of which is incorporated herein by reference; in U.S. patent application Ser. No. 11/870,379, entitled "Ordered Open-Cellular Carbon Microstructures And Method Of Making Same," the entire content of which is incorporated herein by reference; and in U.S. patent application Ser. No. 12/074,727, entitled "Ceramic Microtruss," the entire content of which is incorporated herein by reference. Any of these materials, polymers, metals (including aluminum, copper, steel, etc.), and ceramics (including alumina, yttria stabilized zirconia (YSZ), silicon carbide (SiC), diamond) could be used in these applications although metals are preferred in one embodiment. In embodiments of the present invention, the applications all involve heat transfer. Also, in embodiments of the present invention, multiple layers of the three-dimensional ordered open-cellular microstructures are stacked to achieve a desired thicknesses for certain heat sink applications.

The three-dimensional ordered open-cellular microstructures (microtruss) 10 (after conversion to the desired material) are used in heat sink applications. One implementation is depicted in the embodiment shown in FIG. 7. In this heat sink application, a fluid stream 28 passes through the microtruss 10. Heat is conducted from the device to be cooled 26 through an optional thermal interface material 24 through a heat spreader 22 to the microtruss 10. The heat is finally carried away with the exiting fluid 30. The high surface area to volume ratio of the microtruss structure provides increased heat transfer from the microtruss 10 to the fluid 28. In addition, it should be apparent to those skilled in the art that the embodiments of FIG. 7 can be applicable to any suitable heat sink application.

The heat spreader 22 may be metal, preferably copper, or other thermally conductive material that adheres to the microtruss 10. In addition, the heat spreader 22 may be a heat pipe or a vapor chamber (not shown in FIG. 7). The heat pipe or vapor chamber may be connected to the microtruss 10 such that a fluid in the heat pipe or vapor chamber passes through at least a portion of the microtruss 10. Similarly the thermal interface material 24 is thermally conductive and adheres to the heat spreader 22 as well as the device to be cooled 26. Examples of thermal interface material 24 include but are not limited to: Gap pads, pastes, gels, putties, adhesives, phase change materials (e.g. wax), dry gaskets, solders, and low melt alloys. The optional face sheet material 20 may be metal, ceramic or a heat pipe. The face sheet 20 may be attached to the microtruss through welding, soldering, brazing, diffusion bonding, bonding with an adhesive or other methods known in the art.

Figure 7:
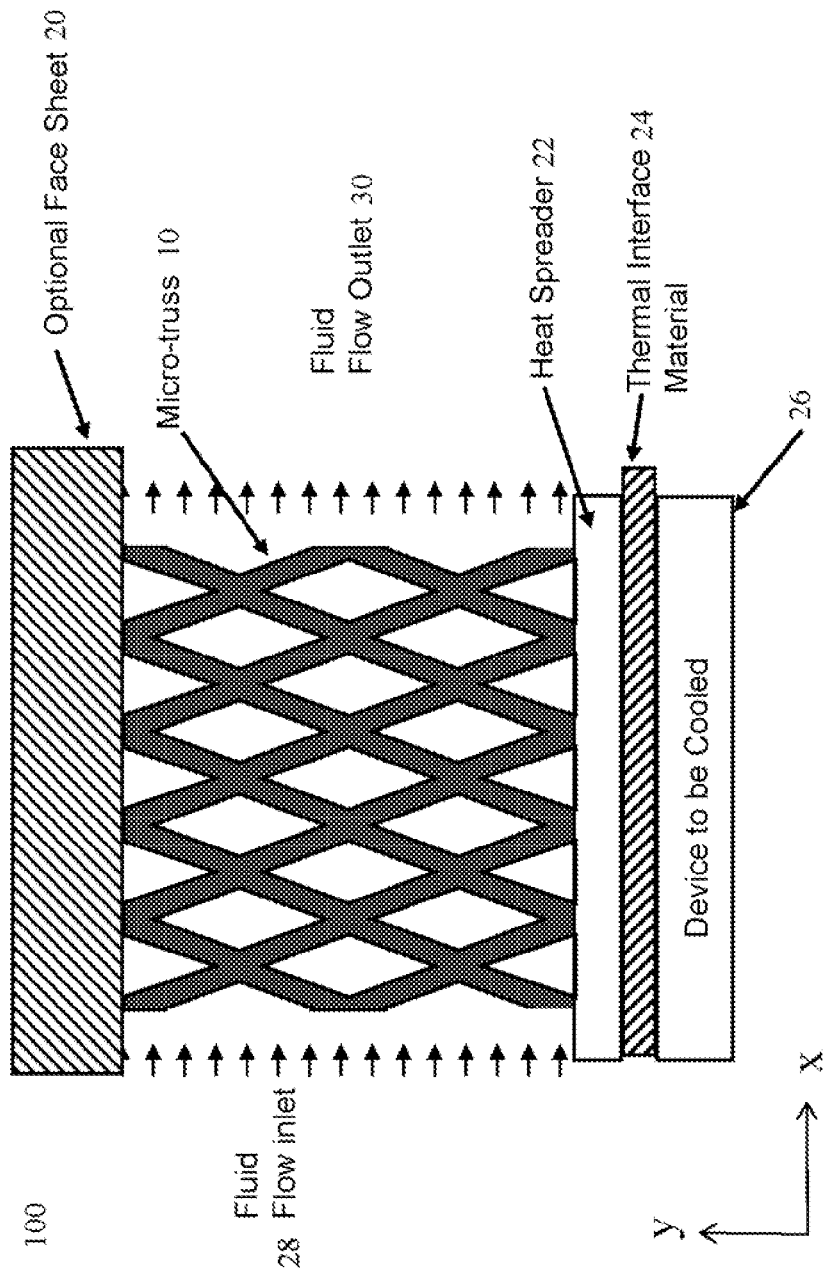
FIG. 7 illustrates an embodiment of a heat sink in the form of microtruss material.
Figure 8:
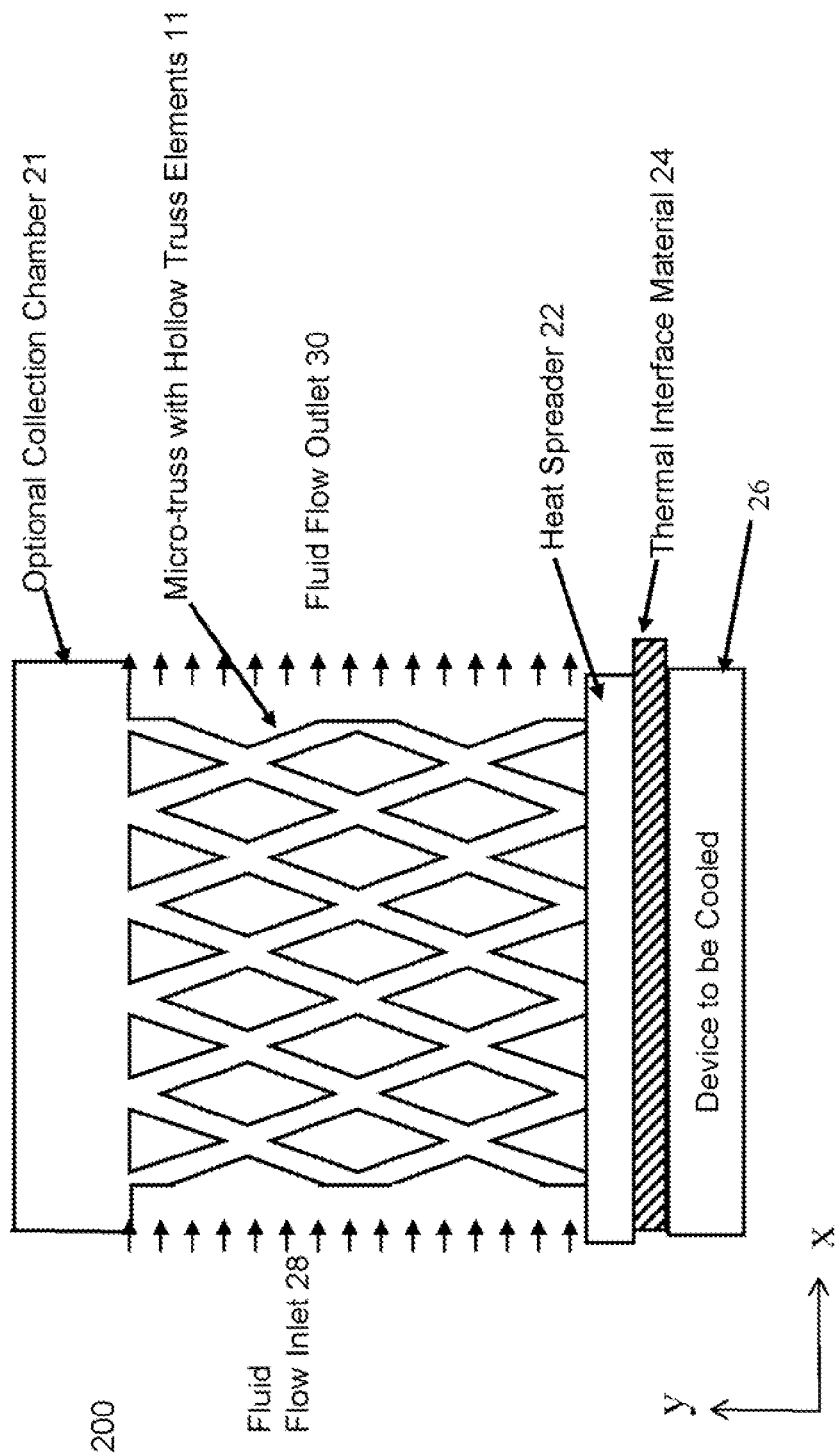
FIG. 8 illustrates an alternative embodiment of a heat sink in the form of microtruss material.
Figure 9:
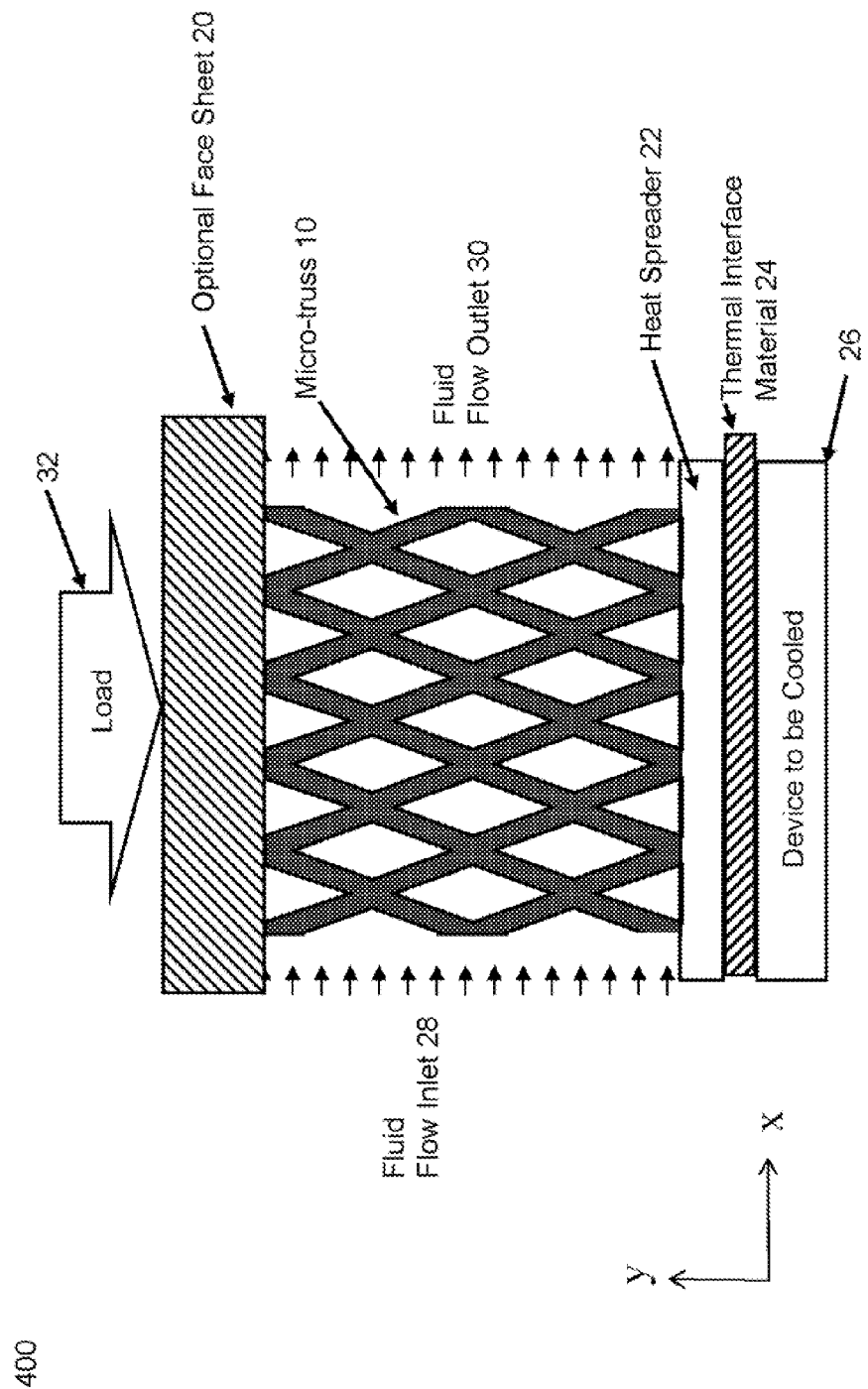
FIG. 9 illustrates an embodiment of a heat sink in the form of microtruss material capable of supporting a load.

In the embodiments of FIGS. 7, 8 and 9 the surface area to volume ratio of a microtruss with truss radius of 50 microns, truss length of 900 microns, and angle of 40 degrees is about 2000 m$^2$/m$^3$. The open volume fraction (i.e. void fraction) for such a structure is about 0.91.

A higher surface area to volume ratio generally leads to increased heat transfer. In general a microtruss has a surface area to volume ratio between 30 and 30,000 m$^2$/m$^3$ with a preferred range of 300 to 15,000 m$^2$/m$^3$. The open volume fraction is between 0.1 and 0.9 with 0.4 to 0.6 being most useful for heat sinks. As the dimensions (or size scale i.e the distance between adjacent nodes 18) of the structure decrease, the overall heat transfer capability of the heat sink increases because the surface area to volume ratio increases, which increases the heat transfer coefficient and increases the surface area in contact with the fluid flowing from fluid flow inlet 28 to fluid flow outlet 30. Hence there is an advantage to building heat sinks of three-dimensional ordered open-cellular microstructure material because of the dimensions or size scale.

FIG. 8 schematically illustrates a heat sink 200 comprising a three-dimensional ordered open-cellular microstructure material with hollow truss elements 11. As in the device shown in FIG. 7 the heat sink of FIG. 8 is for cooling a device. However, the hollow tubes allow improvement in the thermal conductivity of the heat sink by filling the hollow tubes 11 with a high thermal conductivity material or with a fluid to increase convection. If the hollow tubes 11 are filled with a fluid then an optional fluid collection chamber 21 may be used instead of the Face Sheet 20 in FIG. 7. The fluid used in the hollow tubes 11 may be a liquid at the temperature of the environment and a gas at the temperature of the device to be cooled.

FIG. 9 schematically illustrates a heat sink 400 for support of a load 32. Because of the size, ordered nature of the microtruss, its anisotropy, optionally molecular alignment, and the ability to build a microtruss to conform to an irregular surface at the micrometer scale, the microtruss 10 is a good heat sink material when the heat sink must also support a load 32. Here, the structure of the microtruss support could have various suitable geometries, such as flat, crenulated, undulating, etc., as shown in FIG. 10 to conform to irregular surfaces.

In view of the foregoing and according to embodiments of the present invention, micro-structured ordered open cellular materials can be utilized for various suitable heat sink applications, such as electronics cooling.

While the invention has been described in connection with certain exemplary embodiments, it is to be understood by those skilled in the art that the invention is not limited to the disclosed embodiments, but, on the contrary, is intended to cover various modifications included within the spirit and scope of the appended claims and equivalents thereof.

What is claimed is:

1. A heat sink device comprising:
a heat spreader; and
a three-dimensional ordered open-cellular microstructure material attached to the heat spreader;
wherein the three-dimensional ordered open-cellular microstructure material comprises:
a plurality of first truss elements defined by a plurality of first self-propagating polymer waveguides and extending along a first direction;
a plurality of second truss elements defined by a plurality of second self-propagating polymer waveguides and extending along a second direction; and
a plurality of third truss elements defined by a plurality of third self-propagating polymer waveguides and extending along a third direction,
wherein the first, second, and third ordered truss elements interpenetrate each other at a plurality of nodes to form a continuous material.

2. The heat sink of claim 1, wherein the three-dimensional ordered open-cellular microstructure material is comprised of a plurality of layers.

3. The heat sink of claim 1, wherein an angle between intersecting truss elements is less than 90 degrees.

4. The heat sink of claim 1 further comprising a face sheet.

5. The heat sink of claim 1, wherein the three-dimensional ordered open-cellular microstructure material comprises at least two different types of materials.

6. The heat sink of claim 5, wherein the at least two different types of materials comprises a ceramic material and a metal material.

7. The heat sink of claim 1, wherein the three-dimensional ordered open-cellular microstructure material comprises a metal material.

8. The heat sink of claim 1, wherein the first, second and third pluralities of truss elements have a three-dimensional order with a size scale between about ten micrometers and about five millimeters to increase a surface area to volume ratio of the three-dimensional ordered open-cellular microstructure material.

9. The heat sink of claim 1, wherein the three-dimensional ordered open-cellular microstructure material has an open volume fraction between about 0.4 and 0.6.

10. The heat sink of claim 1, wherein the three-dimensional ordered open-cellular microstructure material is comprised of hollow truss elements.

11. The heat sink of claim 10, wherein the hollow truss elements are at least partially filled with a material.

12. The heat sink of claim 10, wherein the hollow truss elements are at least partially filled with a fluid.

13. A heat sink device comprising:
a heat spreader; and
a three-dimensional ordered open-cellular microstructure material attached to the heat spreader;
wherein the ordered open-cellular microstructure material further comprises:
a plurality of first truss elements defined by a plurality of first self-propagating polymer waveguides of the first three-dimensional pattern and extending along a first direction;
a plurality of second truss elements defined by a plurality of second self-propagating polymer waveguides of the first three-dimensional pattern and extending along a second direction;
a plurality of third truss elements defined by a plurality of third self-propagating polymer waveguides of the first three-dimensional pattern and extending along a third direction;
a plurality of fourth truss elements defined by a plurality of fourth self-propagating polymer waveguides of the second three-dimensional pattern and extending along a fourth direction;
a plurality of fifth truss elements defined by a plurality of fifth self-propagating polymer waveguides of the second three-dimensional pattern and extending along a fifth direction;

a plurality of sixth truss elements defined by a plurality of sixth self-propagating polymer waveguides of the second three-dimensional pattern and extending along a sixth direction; and an interface, wherein the first, second, and third truss elements interpenetrate each other at a plurality of first nodes to form a first continuous material, wherein the fourth, fifth, and sixth truss elements interpenetrate each other at a plurality of second nodes to form a second continuous material, and wherein the interface comprises a plurality of third nodes for connecting the first continuous material to the second continuous material.

14. A method of cooling a device with a heat sink, the method comprising:

attaching a heat sink to the device; wherein the heat sink is as described in claim 1.

15. The method of claim 14 further comprising interposing a thermal interface material between the heat sink and the device to be cooled.

16. The heat sink of claim 1, wherein the three-dimensional ordered open-cellular microstructure material has a surface area to volume ratio between about 300 and 15000 $m^2/m^3$.

* * * * *